(12) United States Patent
Neyfakh (10) Patent No.: US 6,216,260 B1
(45) Date of Patent: Apr. 10, 2001

(54) METHOD FOR AUTOMATIC SYNTHESIS OF A DIGITAL CIRCUIT EMPLOYING AN ALGORITHM FLOWCHART

(75) Inventor: Albert E. Neyfakh, New York City, NY (US)

(73) Assignee: Anna Alshansky, Ridgefield, CT (US)

( * ) Notice: Subject to any disclaimer, the term of this patent is extended or adjusted under 35 U.S.C. 154(b) by 0 days.

(21) Appl. No.: 09/241,206

(22) Filed: Feb. 1, 1999

(51) Int. Cl.$^7$ ..................................................... G06F 17/50
(52) U.S. Cl. ................................................................ 716/18
(58) Field of Search ........................................... 716/1, 18

(56) References Cited

U.S. PATENT DOCUMENTS

| | | | |
|---|---|---|---|
| 4,703,435 | * 10/1987 | Darringer et al. | 364/489 |
| 5,029,102 | * 7/1991 | Drumm et al. | 364/489 |
| 5,258,919 | * 11/1993 | Yamanouchi et al. | 364/489 |
| 5,493,504 | * 2/1996 | Minato et al. | 364/488 |
| 5,805,462 | * 9/1998 | Poirot et al. | 364/490 |

OTHER PUBLICATIONS

Cyre, W.R., "Capture, Integration, and Analysis of Digital System Requirements with Conceptual Graphs", IEEE Trans. on Knowledge and Data Engineering, vol. 9, No. 1, Jan.–Feb. 1997, pp. 8–23.*

Edwards, M. D., "Automatic Logic Synthesis Technique for Digital Systems", McGrow–Hill, New York, 1992, pp. 35, 38, 39, 131.

Andras, A., "The Behavior and Simplicity of Finite Moore Automata", Budapest, 1996. no page #s.

Lazarev, V. G. et al., "Synthesis of Control Automata", Energiya, Moscow, 1978, in Russian. no page #s.

Swamy, M. N. S. et al, "Graphs, Networks, and Algorithms", Wiley, New York, 1981. no page #s.

* cited by examiner

*Primary Examiner*—Kevin J. Teska
*Assistant Examiner*—Leigh Marie Garbowski (57) ABSTRACT

A method for automatic synthesis of a digital circuit employing an algorithm flowchart performed by a computer program. The method provides the full description of a digital circuit for an exact algorithm flowchart entered by user according to predetermined instructions. The said digital circuit description is provided in logical bases AND-OR-NOT, AND-NOT, or any other logical basis that can be directly derived from the said AMD-OR-NOT logical basis. The method employs a mathematical description of the algorithm flowchart as a directed graph to determine the theoretically optimal insertion set of the memory elements. The synthesis method provides significant reduction of the time needed for the algorithm realization in comparison with the employment of a programmable processor using the same technology.

1 Claim, 4 Drawing Sheets

|  | z1--z2 | z2--p3 | p3--z4 | z4--z5 | z5--p6 | p6--p7 | p7--z8 | z8--z9 | z9--p10 | p10--z11 | z11--z12 | z12--p13 | p13--E | p3--z2 | p6--z4 | p7-z11 | p10--z1 | p13--z8 |
|---|---|---|---|---|---|---|---|---|---|---|---|---|---|---|---|---|---|---|
| p3-z2 |  | 1 |  |  |  |  |  |  |  |  |  |  |  | 1 |  |  |  |  |
| p6-z4 |  |  |  | 1 |  |  |  |  |  |  |  |  |  |  | 1 |  |  |  |
| p7-z11 |  |  |  |  |  |  | -1 | -1 | -1 | -1 |  |  |  |  |  | 1 |  |  |
| p10-z1 | 1 | 1 | 1 | 1 | 1 | 1 | 1 | 1 | 1 |  |  |  |  |  |  |  | 1 |  |
| p13-z8 |  |  |  |  |  |  |  | 1 | 1 | 1 | 1 | 1 |  |  |  |  |  | 1 |
|  |  | * |  | * |  |  | * |  |  |  |  |  |  |  |  |  |  |  |

METHOD FOR AUTOMATIC SYNTHESIS OF A DIGITAL CIRCUIT EMPLOYING AN ALGORITHM FLOWCHART

BACKGROUND

1. Field of Invention

This invention relates to Electrical Computers and Data Processing Systems and more particularly to Applications to Design and Analysis of Electrical/Electronic Circuits.

2. Description of Prior Art

Usual way of projecting of the equipment that realizes the assigned algorithm consists of the following. (1) The (micro) processor and an appropriate programming language are chosen. (2) The computer program is written and debugged. (3) Read Only Memory that controls the program is hard-wired by the debugged program.

As a rule, the computer instructions very little correspond to the algorithm operations. Hence, each block of the algorithm flowchart is realized by the set (subroutine) of computer instructions. The sequential order of the computer instructions' performance results in slowing down of the computer performance of the assigned algorithm. This is a disadvantage if algorithm has to work in a real-time scale, such as communications network control algorithms, error correcting code decoders' algorithms, rocket missiles pursuing algorithms. Thereafter, the hardware realization of the control algorithms performed as Moore or Mealy automatic machines, is implemented (see *Automatic Logic Synthesis Techniques for Digital Systems*, by M. D. Edwards, McGrow-Hilll, New York, 1992, ISBN 0-07-019417-3).

Digital circuit in a form of automatic machine consists of a set of logical elements, type AND, OR, and NOT (inverter), and binary memory elements. Digital circuit receives digital input signals, performs logic operations for the process of control, and directs its digital output signals to the executive parts of the computer system. Binary memory elements, that configured in the digital circuit, are connected to the outputs of logical elements. Each memory element creates a delay in one clock pulse. Therefore, memory element is implemented (that is, connected to the output of a certain logical element) only if it is needed for the correct realization of a control algorithm.

Implementation of digital circuits instead of programmable processors permits to reduce significantly the clock pulses number needed for the control algorithm realization. The speed of the control process increases by this in ten times or more without the change of the digital electronic technology.

The problem of control algorithms' realization by a digital circuit is solved in the book by M. D. Edwards and other known literature, by compiling and coding the state table of an automatic machine. (There are almost no differences between Moore and Mealy machine, see pg. 35 of the cited book). One of the most important problems in the finite state machines' implementation is the efficient binary encoding of the internal states of the machine (see pg. 38, 39). However, if i is the states' number, then "for i<5 it is not feasible to try all the different assignments by enumerative methods in order to find the most economical combinatorial logic solution" (see pg. 131).

Several improved computerized state assignment algorithms included into the cited book: KISS and CREAM algorithms, MUSTANG technique, NOVA, K-MUSTARD and ASYL approaches. However, these algorithms also do not lead to an optimal solution, and the following recommendation included into the book. "For large finite state machines it can be more efficient to decompose a machine into an interconnection of two or more smaller submachines. The resulted submachines may subsequently be synthesized in the usual way" (pg. 132). This recommendation is caused by the lack of satisfactory solution of digital circuits' synthesis method.

U.S. Pat. No. 5,805,462 to Frank Poirot et al (1998, applicant: VLSI Technology, Inc., San Jose, Calif.) discloses automatic synthesis of integrated circuits employing Boolean decomposition. The problem of proper inclusion of memory elements for multistate algorithm realization is not solved in this invention.

The book *The Behavior and Simplicity of Finite Moore Automata* by Andras Adam, Budapest, 1996 is also devoted to digital circuits realizing the control algorithms. As the book by M. D. Edwards it describes the synthesis of digital circuits with the memory elements with the use of the internal states' table. This implementation is difficult for relatively complicated algorithms.

U.S. Pat. No. 4,703,435 to John A. Darringer et al. (1987, applicant IBM Corporation, Armonk, N.Y.) discloses an automated logic synthesis method. A register-transfer level flowchart specification in this method is translated straightforwardly into a single AND-OR logic implementation. Simplified AND-OR implementation is translated to a NAND or NOR representation, depending on the target technology, after logic implementation expands to elementary representation. The problem of the proper synthesis of automatic machine, realizing any finished algorithm, and including logic (of any type) and memory elements, was not stated in this invention.

U.S. Pat. No. 5,029,102 to Anthony D. Drumm et al (1991, applicant IBM Corporation, Armonk, N.Y.) discloses a logic synthesis method and system for a digital circuit, consisting of basic logic blocks. Method is improved to that of U.S. Pat. No. 4,703,435; some of the said blocks may not be primitive (logic) blocks. Method includes the novel technique for performing logic reduction on the individual expressions. However, the problem of the proper synthesis of automatic machine, for the finished algorithm realization, including logic and memory elements, was not stated in this invention.

U.S. Pat. No. 5,258,919 to Roy K. Yamanouchi et al (1993, applicant National Semiconductor Corporation, CA.) provides a structured integrated circuit design methodology, consisting of the following stages:

1) Describing a two-phase logic function using a highlevel behavioral description flowchart;
2) Reducing trial and error in circuit layout implementation using novel chip planning techniques;
3) Definition of signal types and the type of input signal that feeds the current function. A rigid set of rules is established for the signal types;
4) Technical specification of the two-phase logic function is defined. A behavioral flowchart using defined symbols is created;
5) An associated database of the Boolean equations for the parameters of the flowchart elements is created;
6) Boolean equations are converted to a logic diagram by coded state assignment or by direct implementation;
7) Resulted logic diagram is analyzed for speed utilizing a Figure of Merit technique;
8) Circuit design is carried through to layout by CAD tools. The $6^{th}$ stage among the indicated 8 stages is used to create a Mealy (or Moore) automatic machine and related to the proposed invention. The creation of automatic machine in U.S. Pat. No. 5,268,919 is based on sate assignment, creation of the state transition table, and output table, just as described in the book by M. D. Edwards, pg. 34÷40. Improved algorithms for computerized state assignment, summarized in the book by M. D. Edwards from the previous literature, are not included in this patent. For these reasons the U.S. Pat. No. 5,268,919, as already cited book, cannot be used for the creation and optimization of the relatively complicated digital circuit.

U.S. Pat. No. 5,403,504 to Shin-Ichi Minato (1996, applicant Nippon Telegraph and Telephone Corporation, Tokyo, Japan) discloses a design system of a logic circuit, including a logic synthesis. Logic circuit includes a processing unit, and a set data processing unit. The set data processing unit includes a node table for the elements recording. The control unit of the logic synthesis and processing unit read data from the node table, assign a binary number to each element, and transfer to the data processing unit. The control unit of the data processing unit separates the set data ("0" from "1"), generates a 0-supressed binary decision diagram (BDD) of a logic function, and stores data to the node table. Intermediate nodes in BDD are eliminated. A subset, whose element number is smaller than that of the entire set is represented by a graph with a smaller number of nodes, than in a conventional BDD. Logic circuits, synthesized in this patent, are not related to automatic machines (Finite State Machines) and are not associated with the finished algorithms. The logic circuit examples shown on FIGS. 16, 19, 22 of this patent do not contain flip-flops (memory elements). Such a circuit can perform certain logic operations, but not an assigned algorithm. The problem of the synthesis of automatic machine, realizing an algorithm, including logic and memory elements, was not stated in this patent.

The article "Capture, Integration, and Analysis of Digital Systems Requirements with Conceptual Graphs" by Walling R. Cyre was published in "IEEE Trans. on Knowledge and Data Engineering," vol. 9, No. 1, 1997. Article focuses on the capture, integration, analysis of specifications (from English descriptions). A knowledge representation form, that supports natural language understanding, was selected in the article to be a common notation. This notation is a form of semantic networks called conceptual graphs. Conceptual graphs in this article are a useful tool for representing and combining knowledge or meaning. In the context of digital system requirements, general concept types include the device type, which include all the hardware elements. The type logic memory represents devices, that contain both logic for data manipulation and memory for storage of (type) values. This class of devices contains both processors and counters. Capture is the first step in the automatic evaluation and interpretation of requirements. Capture consists of entry and translation (of the types and values) of system requirements to conceptual graphs. The next direction of the future research is to analyze the preliminary design for cost and performance. Problem of the synthesis of automatic machine, realizing any algorithm (assigned by the user), where algorithm includes logic elements and flip-flops, is not considered in this article.

OBJECTS AND ADVANTAGES

Accordingly, besides the objects and advantages of a Method for Automatic Synthesis of a Digital Circuit described in my above patent, several objects and advantages of the present invention are:

(a) to provide a method for creation of a digital circuit which can work much faster, ten times or more, than a programmable processor using the same technology;

(b) to provide the carrying-out of the digital circuit synthesis method directly according to the algorithm flowchart, during which the output of the realized algorithm operation is performed after and according to other conditional and unconditional operations pointed by the algorithm flowchart configuration;

(c) to provide the said digital circuit synthesis method without the tedious usage of a not optimal representation of a said digital circuit by the state transition table;

(d) to provide the convenience of the said method usage for the user, whose first task is to enter the algorithm according to the attached instructions;

(e) to provide an automatic checking of the syntax of entered algorithm by the computer program included into the said method;

(f) to provide an automatic work of the method and program after successful checking of the entered algorithm;

(g) to provide full description of the created digital circuit realizing entered algorithm in two logical bases: AND-OR-NOT, and AND-NOT;

(h) to provide automatic insertion of binary memory elements into the digital (logic) circuit only on those places, that are needed for the realization of entered algorithm.

Further objects and advantages are to provide the theoretical optimum of the created digital circuit, that is, not any other digital circuit, realizing entered algorithm, cannot work faster (within the limits of the digital technology and logical basis used) than the digital circuit created by the said method and program.

Further objects and advantages will become apparent from a consideration of the ensuing description and drawings.

REFERENCE NUMERALS IN DRAWINGS 1 net of logic elements (AND-OR-NOT or AND-NOT) in generalized from
2 binary memory elements based on flip-flop (m of them)
3 executable devices controlled by the digital circuit (k of them)
4 entry block of an algorithm flowchart
5 unconditional block of an algorithm (8 of them for an example given)
6 conditional block of an algorithm (5 of them for an example given)

7 the end block of an algorithm flowchart

8 AND-NOT logic element of a digital circuit (15 of them for an example given); AND-NOT logic can have more than two inputs 9 inverter, i. e. NOT logic element (9 of them for an example given)

Figure 7:
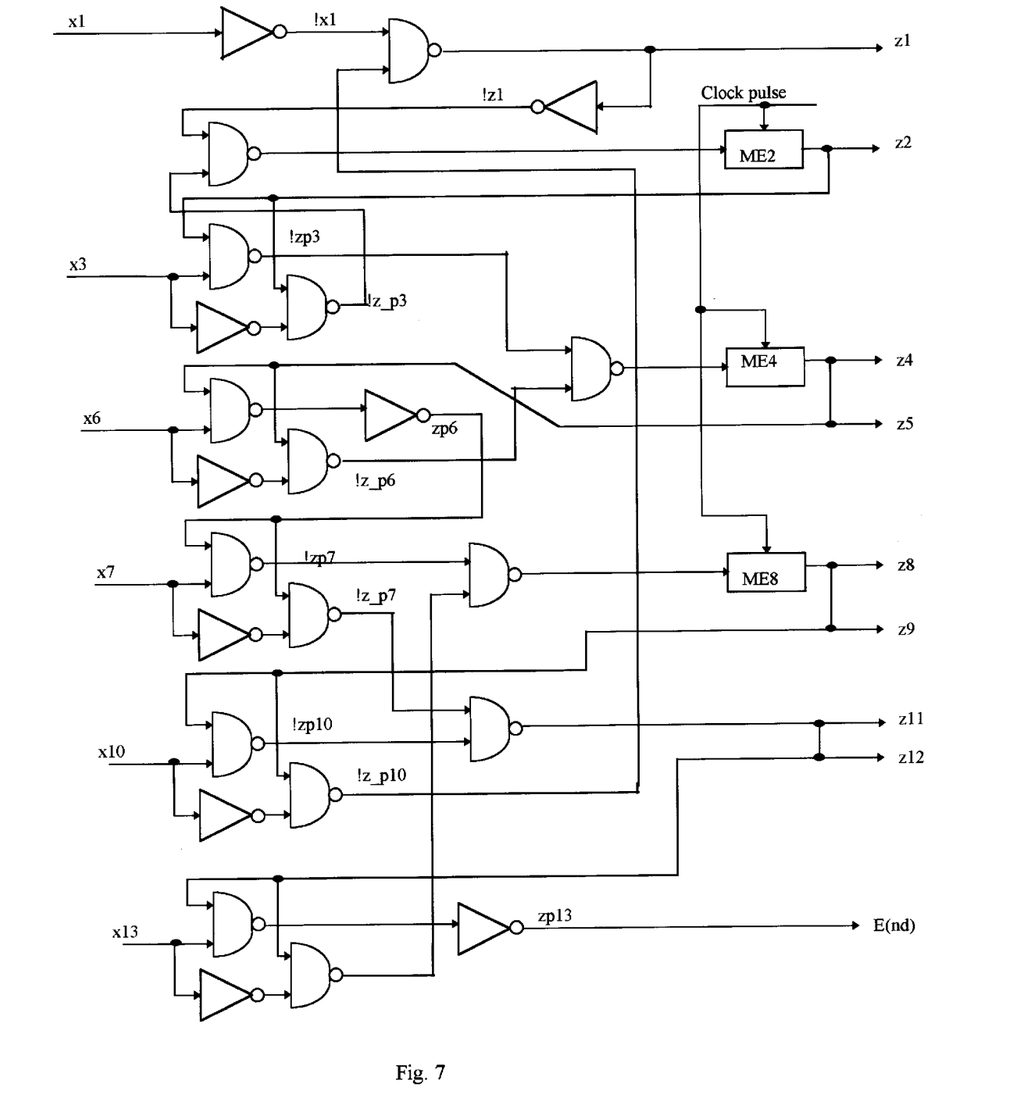
FIG. 7 shows a functional diagram of an example of a digital circuit with an AND-NOT logical basis. This circuit realizes the algorithm example shown on FIG. 3.

10 memory element, i. e. flip-flop (3 of them for an example given), setup of the zero state of the flip-flops is not shown on FIG. 7.

METHOD FOR AUTOMATIC SYNTHESIS OF A DIGITAL CIRCUIT EMPLOYING AN ALGORITHM FLOWCHART

Description—FIGS. 1 to 7

This invention generally relates to applications to design and analysis of digital electronic circuits. The purpose of this invention is to create a digital circuit realizing a control algorithm in a theoretically minimal number of clock pulses of the main frequency. The said pulses' number decrease means an acceleration of the control algorithm performance, which is very important for systems and equipment working in a real-time scale.

The digital circuit is created in a form of Mealy automatic machine, which consists of a net of logic elements and a few binary memory elements. Logic elements are type AND, OR, and NOT (inverter). Memory elements are flip-flops. Memory elements are inserted into the net of logic elements when it is needed for the correct realization of an assigned control algorithm. Digital circuit created in the logical basis AND, OR, and NOT is transformed into the second logical basis AND-NOT. Output with the digital circuit based on logic elements AND, NOT is given separately. Logic elements AND, NOT directly correspond to digital electronic elements in integrated circuits (chips). The block diagram of a digital circuit in generalized form is shown on FIG. 1. Set of n inputs $x_1, \ldots, x_n$ (from outside) connected to logic elements included into the net. Set of the logic elements outputs is denoted as $\{z_1, \ldots, z_k\}$. The said outputs are connected to k executable devices $Ex_1, \ldots, Ex_k$. Additional m outputs of the said net connected to the binary memory elements inputs $ME_1, \ldots, Me_m$. Memory elements outputs $x_{n+i}$, where $1 \leq i \leq m$, influence the logic elements from the net at the next clock pulse of the main frequency after they receive the inputs $s_i$. Memory elements outputs are connected to the net of logic elements as additional m inputs. The logic elements' connections within the net are determined by the algorithm flowchart configuration. This is the first key point of the invention explained later by example. This key point makes unnecessary the tedious usage of the state diagram, as in the book by M. D. Edwards.

The said flowchart may be considered mathematically as directed (oriented) graph (see *Graphs, Networks, and Algorithms* by M. N. S. Swamy and K. Thulasiraman, New York, Wiley, 1981). The second key point of the invention is the determination of the binary memory elements' necessity by the methods of the directed graph theory. This key point provides the memory elements' inclusion only if necessary. Each memory element $Me_i$ where $1 \leq i \leq m$ creates a delay of 1 pulse of the main pulse frequency for an output signal $x_{n+i}$ in regard to an input signal $s_i$ (see FIG. 1). Hence a digital circuit with minimal quantity of memory elements will create a minimal delay for a realization of an assigned algorithm.

Criterion of a memory element necessity is determined as follows. Oriented graph representing an algorithm flowchart, has cycles. Part of these cycles can be directed (Theory of directed cycles is described in the cited book by M. N. S. Swamy et al). Part of algorithm flowchart is shown as an example on FIG. 2. The cycle including the conditional blocks p1, p3, and unconditional block z2, is directed (marked by bold lines). An algorithm part shown on FIG. 2 has also other cycles, for an example, the cycle consisting of elements p1, p4, p3, and z2. This cycle is not directed. Realization of an algorithm flowchart, that contains a directed cycle, by the digital circuit cannot include only logic elements (logic circuits). Otherwise logic elements within the directed cycle will spontaneously generate each other. Such a system will not be workable. To make the digital system workable it is required to "tear off" each directed cycle by the memory element. The spontaneous generation through the memory element with the time delay is not possible. The memory elements' quantity can be minimized if some memory elements will "tear off" more than one cycle. In that case the total delay of an algorithm realization in a digital circuit will be minimized, and the speed will be maximized.

Figure 1:
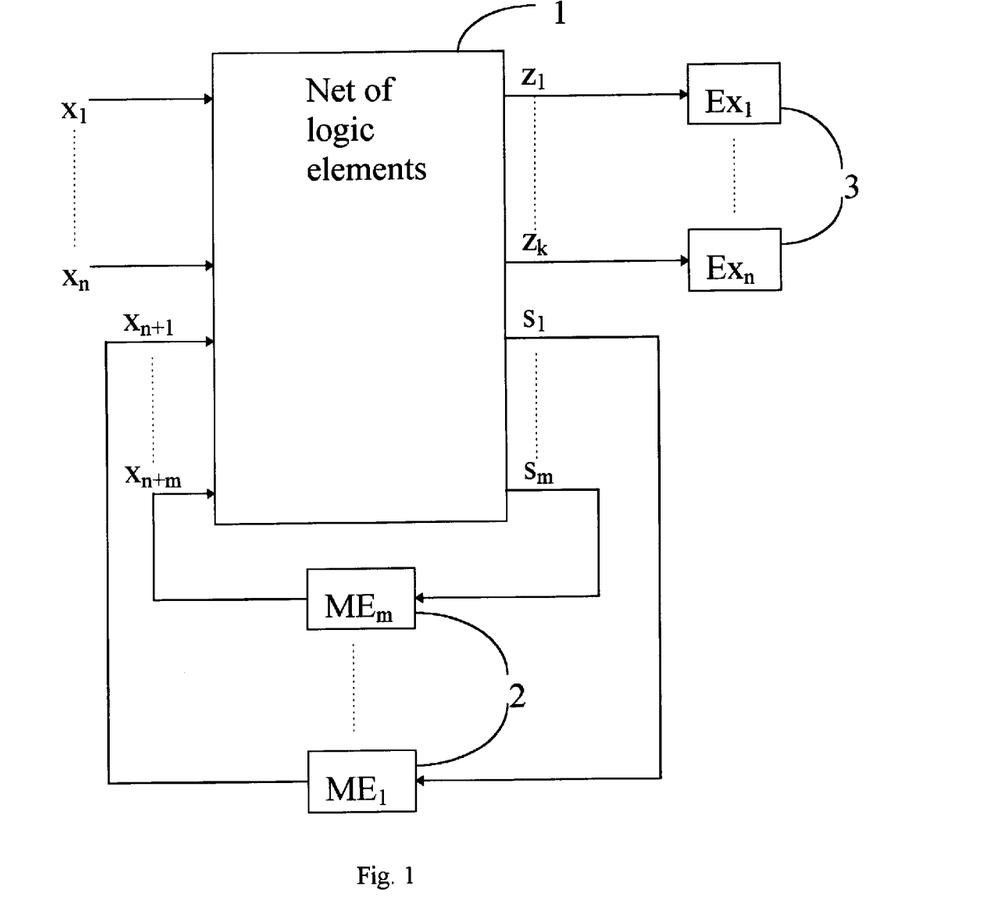
FIG. 1 shows a generalized form of a digital circuit. The said circuit is performed logically as a Mealy automatic machine.
Figure 2:
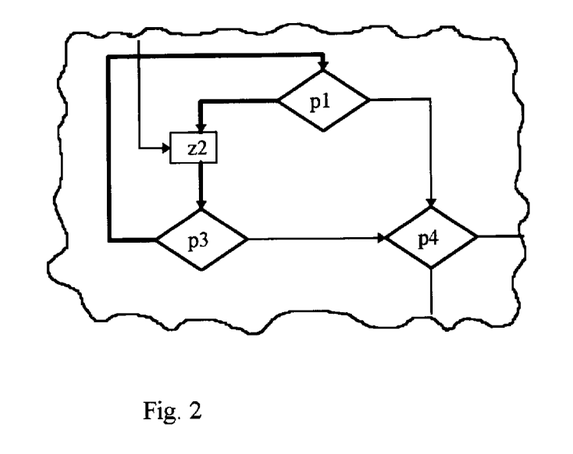
FIG. 2 shows an example of a part of an algorithm flowchart with a directed (oriented) cycle and not directed cycle.
Figure 3:
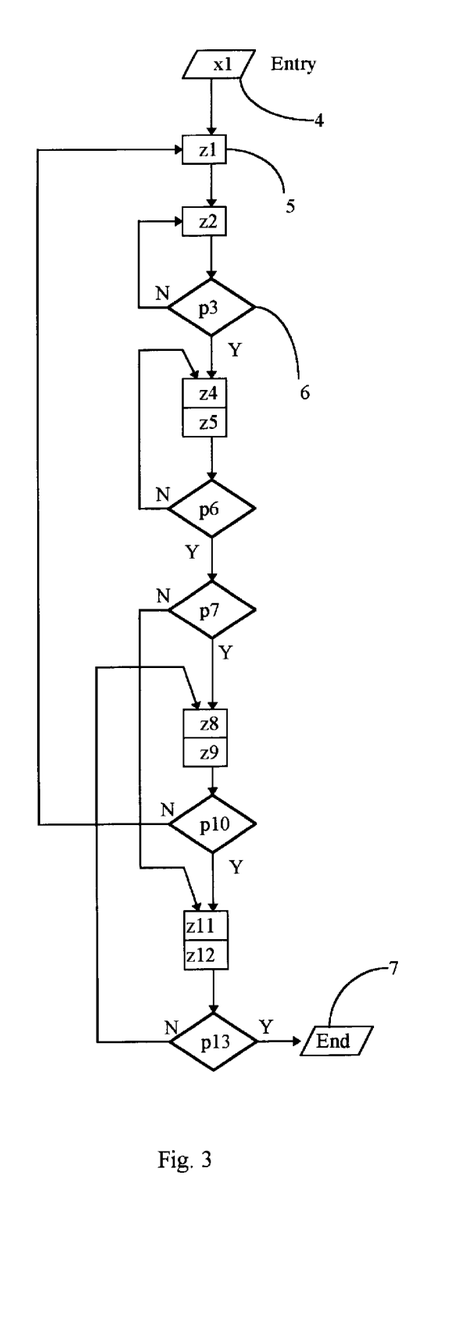
FIG. 3 shows a flowchart example of an algorithm used throughout a description. The said flowchart is considered mathematically as a graph.

An example of an algorithm flowchart is shown on FIG. 3. As on FIG. 2, the blocks z1, z2, z4, and others are unconditional, and the blocks p3, p6, and so on, are conditional. The connection lines between the blocks z4 and z5, z8 and z9, z11 and z12 (without the branching) are omitted on FIG. 3.

Figure 4:
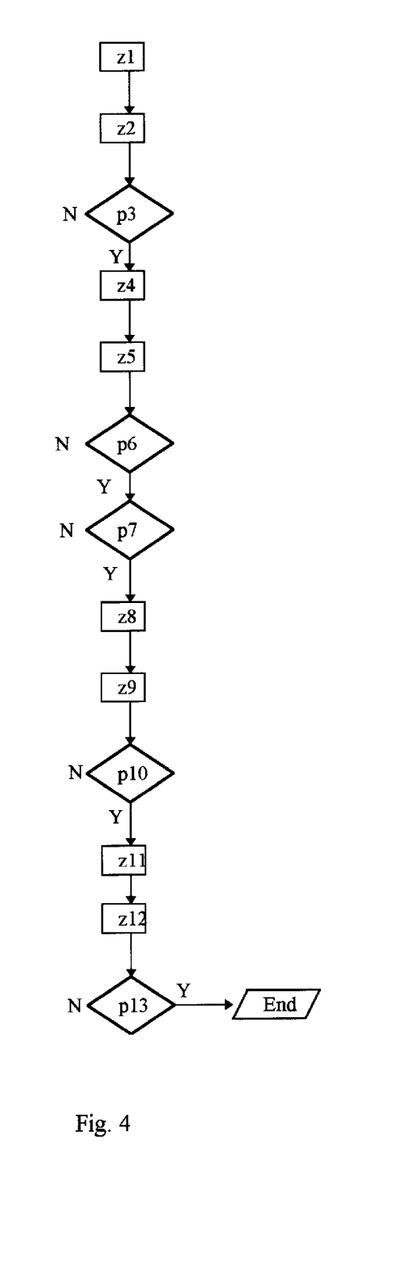
FIG. 4 shows a frame for the graph example shown on FIG. 3.
Figure 5:
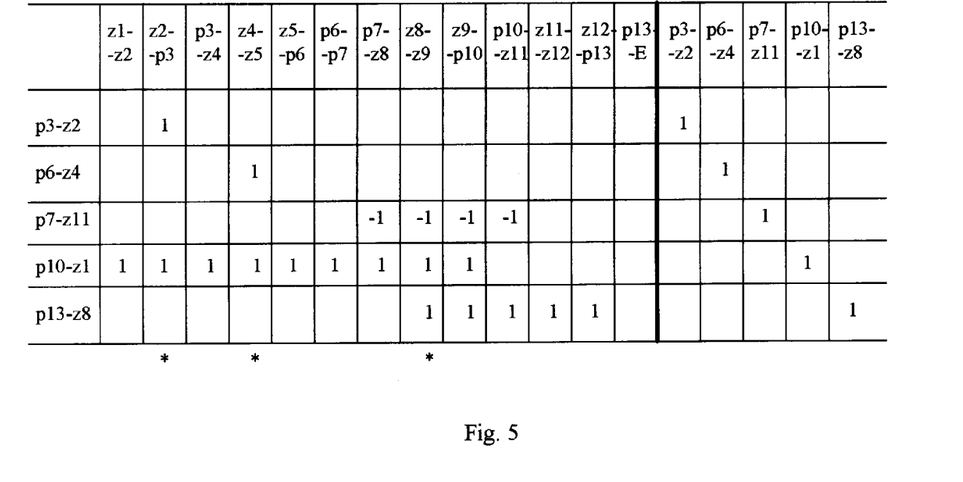
FIG. 5 shows a matrix of basic cycles for the graph example shown on FIG. 3.
Figure 6:
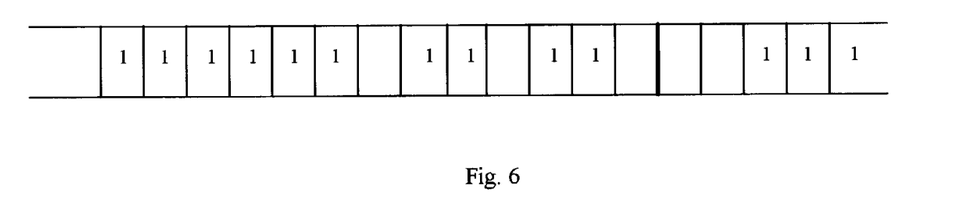
FIG. 6 shows a matrix of all directed cycles that are not present among basic cycles shown on FIG. 5. There is one such cycle for the graph shown on FIG. 3.

Determination of oriented cycles in the algorithm flowcharts is performed by the use of graph frame and the cycles' generator matrix; method is described in the book by M. N. S. Swamy et al. The graph frame for the example is shown on FIG. 4. All the 14 blocks of an algorithm flowchart FIG. 3 are shown on the frame (entry block x1 is not considered as a block of an algorithm). Part of the connection lines named the graph edges are excluded. Only 13 edges left necessary to connect all the blocks of an algorithm flowchart. These blocks are named nodes of the graph. The edges present on FIG. 4 are named frame edges. There are no cycles in the frame. The edges removed from the algorithm graph FIG. 3 are named additional edges. Each of the five additional edges on the graph FIG. 3 forms the basic cycle in aggregate with the frame edges. The basic cycles are represented on the basic cycles' matrix, see FIG. 5. Each matrix column corresponds to the graph edge: the left 13 columns correspond to the frame edges, right 5 columns—to additional edges. Lines on the matrix represent the basic cycles itself. An entry in the matrix line equals 1 if the edge direction coincides with the chosen direction of the cycle traversal. An entry equals −1 if the edge direction opposes to the chosen traversal direction. There is no entry (considered as 0) if the edge is nor present in the basic cycle. Each line of the matrix FIG. 5 can be added to any other line as a vector. The sum will represent a derived cycle. The line can be multiplied by −1 before an addition, that means the change of a traversal direction. The sum entry more than 1 or less than −1 means that an edge in a derived cycle is traversed more than once. All possible line sums represent all available derived cycles in the algorithm graph. If all the nonzero line coefficients have the common sign, "+" or "−", then the cycle is directed. There are four directed cycles in the matrix FIG. 5: in $1^{st}$, $2^{nd}$, $4^{th}$, and $5^{th}$ lines. One more directed cycle can be obtained by adding $3^{rd}$, $4^{th}$, and $5^{th}$ lines (see FIG. 6). It is shown later, that there are no other directed cycles in this algorithm graph example except these five.

It can be seen from the algorithm flowchart that unconditional operation z1 has to work in two cases: either the signal comes from an input block x1, or conditional operation p10 gives negative result. If the positive operation result is denoted as zp10, negative result as z_p10, then the condition for the operation z1 work can be expressed by the following logic formula:

$$z1 = z\_p10 \cup x1. \qquad (1)$$

However, the similar formula for the operation z2, that is: z2=z_p3∪z1, cannot be valid, because operation z2 initiates the conditional operation p3. If this conditional operation has negative result, then operations z2 and p3 would generate each other and digital circuit would fail to work. This situation can be also seen on the first line of the basic cycles' matrix FIG. 5. This cycle has to be "torn off" by the time delay (created by the memory element). The insertion place for the memory element (ME) has to be the graph edge beginning with unconditional node (algorithm block), because unconditional algorithm block has only one output. It will be the second edge for the 1$^{st}$ cycle on line 1 (marked by the star on FIG. 5). The condition for the work of operation z2 can be expressed by the logic formula similar to (1), where the [t−1] designates the delay created by the ME $$z2 = (z\_p3 \cup z1)[t-1]. \qquad (2)$$

The conditional operation p3 works differently depending on the value of the condition x3 assigned to it. As this operation is initiated by the z2 operation, the work of the conditional operation p3 can be expressed by the pair of logic formulas $$zp3 = z2 \cap x3,$$
$$z\_p3 = z2 \cap !x3, \qquad (3)$$

where !x3 is the inversion of the logic variable x3. Notation for an inversion "!x3" as in "C" programming language is used instead of $\overline{x3}$ more known in logic theory because it is more convenient to implement in programming.

Each ME can "tear off" more than one directed cycle. All directed cycles shown on FIG. 5, 6 can be "torn off" by three ME related to 2$^{nd}$, 4$^{th}$, and 8$^{th}$ edges. According to the configuration of the algorithm flowchart FIG. 3 the rest of the logic formulas for the algorithm operations can be written (including the needed ME) as follows:

$$z4 = (z\_p6 \cup zp3)[t-1]; \qquad (4)$$
$$z5 = z4; \qquad (5)$$
$$zp6 = z5 \cap x6;$$
$$z\_p6 = z5 \cap !x6; \qquad (6)$$
$$zp7 = zp6 \cap x7; \qquad (7)$$
$$z\_p7 = zp6 \cap !x7;$$
$$z8 = (z\_p13 \cup zp7)[t-1]; \qquad (8)$$
$$z9 = z8; \qquad (9)$$
$$zp10 = z9 \cap x10; \qquad (10)$$
$$z\_p10 = z9 \cap !x11;$$
$$z11 = z\_p7 \cup zp10; \qquad (11)$$
$$z12 = z11; \qquad (12)$$
$$zp13 = z12 \cap x13; \qquad (13)$$
$$z\_p13 = z12 \cap !x13;$$
$$E = zp13. \qquad (14)$$

Compilation of the logic formulas according to algorithm flowchart configuration together with the ME insertion to form the delay in one cycle of the main frequency, makes unnecessary the tedious compilation of the state diagram for an algorithm. This advantage of the invention was mentioned previously.

Configuration of the algorithm flowchart FIG. 3 shows that if at least one of the conditions x3, x6, or x10 for conditional operation blocks p3, p6, p10 equals 0, an algorithm cannot proceed. However, if x3=x6=x10=1, and p7=1, the proceed of an algorithm would experience delays in 1 clock pulse of the main frequency at unconditional operations z2, z4, and z8. Hence, algorithm would be performed in 4 clock pulses. Algorithm would be performed in 3 clock pulses of the main frequency if p7=0, because in that case operation z8 would be passed over.

Formulas (1)÷(14) implement the logical basis AND-OR-NOT. It is more convenient to use the logical element AND-NOT representing the transistor elements of the chips. Formula (1) can be rewritten in the AND-NOT basis as follows:

$$z1 = z\_p10 \cup x1 = !(!z\_p10 \cap !x1); \qquad (15)$$

According to formula (15) each signal z_p10 and x1 are connected to the inverter input. Outputs of both inverters are connected to the inputs of the AND-NOT digital element. The rest of the logical formulas (2)÷(4), (6)÷(8), (10), (11), (13) can be transformed as follows:

$$z2 = !((!z\_p3 \cap !z1)[t-1]; \qquad (16)$$
$$zp3 = !!(z2 \cap x3); \qquad (17)$$
$$z\_p3 = !!(z2 \cap !x3);$$
$$z4 = !((z\_p6 \cap !zp3)[t-1]); \qquad (18)$$
$$zp6 = !!(z5 \cap x6); \qquad (19)$$
$$z\_p6 = !!(z5 \cap !x6);$$
$$zp7 = !!(zp6 \cap x7); \qquad (20)$$
$$z\_p7 = !!(zp6 \cap !x7);$$
$$z8 = !((!z\_p13 \cap !zp7)[t-1]); \qquad (21)$$
$$zp10 = !!(z9 \cap x10); \qquad (22)$$
$$z\_p10 = !!(z9 \cap !x10);$$
$$z11 = !(!z\_p7 \cap !zp10); \qquad (23)$$
$$zp13 = !!(z12 \cap x13); \qquad (24)$$
$$z\_p13 = !!(z12 \cap !x7).$$

Formulas (5), (8), (9), (12), (14) do not change in the AND-NOT basis. Formulas (5), (8), (9), (12), (14), (15)÷(24) can be used as an immediate direction for the drawing a digital circuit using the following elements. inverter ─▷─, logic element AND-NOT ⇒D─ and memory element ME-flip-flop type D. The digital circuit realizing algorithm FIG. 3 by implementing the above listed formulas is shown on FIG. 7. Three memory elements are numbered according to delayed unconditional operations. Digital circuit FIG. 7 can be implemented in an integrated circuit. The zero state setup is not shown on FIG. 7.

In a similar way the formulas (1)÷(14) can be used also as an immediate direction for the drawing of a digital circuit in the AND-OR-NOT logical basis. Then the following elements implemented in formulas (1)÷(14) have to be used: inverter, logic element OR, logic element AND, and the same memory element (3 of them) as in the previous case. However, implementation shown on FIG. 7 is more convenient and preferable.

For the programming purpose the "C" language was chosen. The computer program using the said method for automatic synthesis is implemented in the following order:

1. The entry of the control algorithm into the program as its initial data. The initial data entry can be replaced by preliminary data preparation into the file;
2. The syntax and logical checking of the entered algorithm;
3. Formation of the frame for the graph of the algorithm flowchart;
4. Compilation of the two edge lists: frame edges, and a list of additional edges not included into the frame;
5. Formation of the matrix of basic cycles. Each basic cycle as in an example consists of one additional edge and the frame edges;
6. Compilation of the matrix included all directed (oriented) cycles;
7. Determination of the graph nodes (unconditional algorithm operations) for the theoretically optimal memory elements insertion;
8. Formation of the set of logic formulas for the digital circuit based on AND-OR-NOT logical basis;
9. Compilation of the set of logic formulas for the digital circuit based on AND-NOT logical basis.

The development of the computer program for an automatic synthesis of a digital circuit employing an entered algorithm is not brought to the circuit drawing as on FIG. 7 for an example, for three reasons.

The first reason that a circuit drawing according to logic formulas is not complicated task (for the user) that can be performed in the straightforward manner.

The second, most important reason, is that the result of the program work has to provide the exact data for an integrated circuit manufacture. The exact formulas is a better source for that than a circuit drawing with uncertain dimensions.

The third reason is that an automatic circuit drawing will need an implementation of a visual programming language, such as "Visual Basic" or "Visual C". Visual programming language needs more random access memory than plain "C". Hence, calculation can be made for the algorithm less size (with the less quantity of algorithm operations permitted). That will lead to a worsening of the proposed method implementation.

Algorithm flowchart (such as shown on FIG. 3) is entered into a program in the form of Logic Scheme of Algorithm (LSA) stated in the book *Synthesis of Control Automata* by V. G. Lazarev and E. I. Peeil, Moscow: Energiya, 1978, in Russian. LSA is written in a single line. Any unconditional operation is designated by a letter z with a number. The final unconditional operation can be designated by a letter F with a number if there are at least two finals. Conditional operation is designated by a letter p with a number. A condition x# with the same number as for p#, is assigned to the p# operator. The variable x#=1 if the condition is met and x#=0 if the condition is not met. All the operations performed sequentially (from left to right). An arrow-up operator with a number goes after each conditional operator p# to denote the second path after the conditional operator of the algorithm. The control process goes to the next right operator after a conditional operator p# if its condition is met: x#=1. The process goes under a direction of arrow-up operator ♠-number if the condition x#=0 (not met) to the arrow-down operator ♥-number having the same number as arrow-up operator. The process goes to the nearest conditional or unconditional algorithm operator to the right of the arrow-down operator. There can be several arrow-up operators with the same number but only one arrow-down operator for each number. The last operator is E; immediate unconditional operator before E can be F# (in case that there are at least two F's: F1 and F2). The rule is formulated in this invention for the "z" and "p" operations' numbers: the numbers incremented successively form left to right for unconditional and conditional operators. LSA for the algorithm example FIG. 3 is the following:

$$x1♥1z1♥2z2p3♠2♥3z4z5p6♠3p7♠4♥5z8z9p10♠1$$
$$♥4z11z12p13♠5E. \qquad (25)$$

The program realizing the said method is performed as two "C" files. The files have the names after compilation: alg_wrk.exe and alg_2.exe. The first file starts the second file through the batch file transfer. bat having the following content:

@echo off
ALG_2
rem

Each of the above mentioned 9 tasks is performed by the special subprogram-function. Tasks 1÷6 are included into the first file with the source code alg_wrk.c. Tasks 7÷9 are included into the second file (source alg_2.c).

Task 1—entry of an algorithm is performed by the function void algorithm_task(int argc, char argv) for the first file (source alg_wrk.c). The work of the function void algorithm_task( . . . ) may be avoided by an operator using the preliminary preparation of the algorithm file on DOS editor or a similar word processor.

Note: the ♠ and ♥ symbols are entered by their ASCII codes, accordingly 30 and 31.

Task 2—the syntax check-up of the entered algorithm is performed by the function void check_lsa(int argc, char argv[ ]). This check-up can be avoided by the user's response.

Task 3—the graph frame compilation for an algorithm flowchart—is performed by the function voidframe(int argc, char argv[ ]).

Task 4—compilation of the two edge lists for the frame and additional edges is performed by the function void edge lists(int argc, char argv[ ]).

Task 5—formation of the basic cycles matrix is performed by the function void cycle_matrix().

Additional functions for this task are:
int empty(struct edge_seq.sq)—for an analysis of the two kinds of stack;
void pushStack(struct edge x, int y, int y2), | to enter edge x into two kinds of stacks, y—the edge number
void pushBf2(struct edge x, int y, int y2) | in the cycle, y2—the number of a vertex found in the edge;
struct edge popstack(), struct edge popBf2()—to withdraw an edge from two kinds of stack;
int popStNum()—to determine the edge number in the cycle.

Task 6—compilation of the matrix of all directed (oriented) cycles is performed by the function void oriented_cycl().

The rest three tasks are included into the second file with the source code alg_2.c.

Task 7—determination of the theoretically optimal memory elements insertion into the digital circuit is performed by the function delays_insert().

Task 8—formation of the logic formulas set based on AND-OR-NOT logical basis is performed by the function and_or_not_basis().

Task 9—compilation of the logic formulas set based on AND-NOT logical basis is performed by the function and_not_basis().

The source code of the program is quoted in the Supplement 1.

The full program description with explanations is given in the Supplement 2.

Operation

Operation of a user with the program begins by the following typing under the DOS prompt:

D:\DIRNAME>alg_wrkfname<Enter>, where:

D—the hard or floppy disk drive used;
DIRNAME—the directory where the files alg_wrk.exe, alg_2.exe, and transfer. bat are stored;
fname—the file name (including the path) of the LSA.

The short user's instruction is printed on the screen if the user types alg_wrk without the frame.

The inscription "Do you wish to enter your LSA? Print 'y' or 'n'." appears next on the screen. The user can press 'y' and enter LSA if it is not preliminarily prepared. The characters ♥ and ♠ are entered by their ASCII codes (accordingly 31 and 30) during a LSA entry. The user has to press 'y' if the LSA file (under thefname) preliminarily prepared.

Then the inscription "Do you wish to check your LSA? Print 'y' or 'y'." appears next. The user is advised to press 'y' especially if the LSA is used for the first time. The program exits and prints the place of the mistake on the screen if any.

The program prints "Working" on the screen if it does not find any mistakes in the LSA file. Then the program prints "Done." On the screen at the successful end. The program creates two new files in the directory DIRNAME in the success case:

andornot containing the set of logic formulas based on AND-OR-NOT logical basis;
andnotba containing the set of logic formulas based on AND-NOT logical basis.

Each newly created file contains exact logic together with the optimal memory placement needed for the realization of the control algorithm LSA entered.

Summary, Ramification, and Scope

Accordingly, the reader will see that the method for automatic synthesis of a digital circuit employing an algorithm flowchart provides the full needed description of a created digital circuit for an exact algorithm flowchart. The synthesis method provides the reduction of time needed for the algorithm realization in ten times or more in comparison with the employment of programmable processor using the same technology.

Furthermore, the said method has additional advantages in that it allows to enter an algorithm flowchart manually or from a file preliminarily prepared by a word processor;

it permits to check automatically the syntax of entered algorithm or not to check it by the user's choice;

it uses a mathematical description of entered algorithm as a directed graph with the purpose to determine the theoretically optimal insertion set of memory elements;

it creates a graph frame as a part of an algorithm flowchart;

it compiles a matrix of basic cycles whereby each cycle comprises the frame edges and one algorithm graph edge not included in the frame;

it creates automatically a matrix of all directed cycles;

it provides an automatic insertion of theoretically optimal set of memory elements into the created digital circuit;

it provides the full description of the created digital circuit realizing entered algorithm in logical basis AND-OR-NOT.

Although the description above contains many specifications, these should not be construed as limiting the scope of the invention but as merely providing illustrations of some of the presently preferred embodiments of this invention. For example, the digital circuit can be created in AND-NOT logical basis or any other logical basis.

Thus the scope of the invention should be determined by the appended claims and their legal equivalents, rather thm by the example given.

I claim:

1. A method for automatic synthesis of a digital circuit employing an algorithm flowchart providing the full needed description of a created digital circuit for an exact algorithm flowchart entered by the method user, for the purpose of reduction of time needed for the algorithm realization in comparison with the employment of programmable processor using the same technology, comprising the steps of:

(a) entering an algorithm flowchart from a file or manually;

(b) automatic checking of the syntax of said algorithm flowchart;

(c) determining a mathematical representation of said algorithm flowchart as a directed graph to determine the theoretically optimal insertion set of the memory elements needed for providing the full description;

(d) automatic creation of a graph frame as a part of said algorithm flowchart;

(e) automatic creation of a matrix of basic cycles whereby each cycle comprises frame edges and one directed graph edge that is not included in said graph frame;

(f) automatic creation of a matrix of all directed cycles;

(g) automatic insertion of binary memory elements into said created digital circuit only at those places that are needed for the realization of said entered algorithm flowchart;

(h) providing a theoretically minimal quantity of said memory elements by tearing off a maximal quantity of said directed cycles by each memory element;

(i) providing the full description of said digital circuit by realizing said entered algorithm flowchart in the logical basis AND-OR-NOT; and (j) providing the full description of the said created digital circuit by realizing said entered algorithm flowchart in the logical basis AND-NOT or any other logical basis that can be directly derived from said AND-OR-NOT logical basis.

* * * * *